United States Patent
Maluf et al.

(12)

(10) Patent No.: US 10,880,409 B2
(45) Date of Patent: Dec. 29, 2020

(54) MIXED QUALITATIVE, QUANTITATIVE SENSING DATA COMPRESSION OVER A NETWORK TRANSPORT

(71) Applicant: Cisco Technology, Inc., San Jose, CA (US)

(72) Inventors: David A. Maluf, Mountain View, CA (US); John George Apostolopoulos, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 184 days.

(21) Appl. No.: 15/485,717

(22) Filed: Apr. 12, 2017

(65) Prior Publication Data

US 2018/0241852 A1    Aug. 23, 2018

Related U.S. Application Data

(60) Provisional application No. 62/461,070, filed on Feb. 20, 2017.

(51) Int. Cl.
*H04L 29/06* (2006.01)
*H04L 12/40* (2006.01)
(Continued)

(52) U.S. Cl.
CPC .............. *H04L 69/04* (2013.01); *H03M 7/30* (2013.01); *H04L 12/40* (2013.01);
(Continued)

(58) Field of Classification Search
CPC ... H04L 69/04; H04L 12/40; H04L 12/40013; H04L 67/12; H04L 2012/40215;
(Continued)

(56) References Cited

U.S. PATENT DOCUMENTS 7,420,992 B1 *  9/2008  Fang .................. H04L 12/4633
                                                370/477
7,484,008 B1 *  1/2009  Gelvin ................... H04L 67/12
                                                709/249
(Continued)

FOREIGN PATENT DOCUMENTS

CN          102507190 A       6/2012

OTHER PUBLICATIONS

Liu, et al., "Data Compression and Transmission Method of Vehicle Monitoring Information Collection Based on CAN Bus", International Journal of Interdisciplinary Telecommunications and Networking (IJITN), 10 pages, 2015, IGI Global.

(Continued)

*Primary Examiner* — Vivek Srivastava
*Assistant Examiner* — Binod J Kunwar
(74) *Attorney, Agent, or Firm* — Behmke Innovation Group; Kenneth J. Heywood; Jonathon P. Western

(57) ABSTRACT

In one embodiment, a device in a serial network de-multiplexes a stream of traffic in the serial network into a plurality of data streams. A particular one of the data streams is associated with a particular endpoint in the serial network. The device determines that data from the particular data stream associated with the particular endpoint should be reported to an entity external to the serial network based on an event indicated by the data from the particular data stream. The device quantizes the data from the particular data stream. The device applies compression to the quantized data to form a compressed representation of the particular data stream. The applied compression is selected based on a data type associated with the data. The device sends a compressed representation of the particular data stream to the external entity as Internet Protocol (IP) traffic.

20 Claims, 15 Drawing Sheets

(51) Int. Cl.
*H04L 29/08* (2006.01)
*H03M 7/30* (2006.01)
(52) U.S. Cl.
CPC ........ *H04L 12/40013* (2013.01); *H04L 67/12* (2013.01); *H04L 2012/40215* (2013.01); *H04L 2012/40228* (2013.01)
(58) Field of Classification Search
CPC ...... H04L 2012/40228; H04L 47/2433; H03M 7/30; H04W 4/44
USPC ...................... 709/247; 375/245; 701/522, 2; 700/702, 714
See application file for complete search history.

(56) References Cited

U.S. PATENT DOCUMENTS

| | | | | |
|---|---|---|---|---|
| 8,269,618 | B2* | 9/2012 | Murray | B60R 25/04 340/441 |
| 8,358,686 | B2* | 1/2013 | Stephan | H04N 19/61 375/240.01 |
| 8,624,758 | B2* | 1/2014 | Ingram | G08G 1/20 340/995.1 |
| 8,705,527 | B1 | 4/2014 | Addepalli et al. | |
| 8,718,797 | B1* | 5/2014 | Addepalli | B60R 16/023 700/17 |
| 8,904,044 | B2* | 12/2014 | Ebling | G06F 15/16 600/300 |
| 8,949,466 | B1* | 2/2015 | Crosbie | H04W 4/70 709/247 |
| 9,448,300 | B2 | 9/2016 | Jansen et al. | |
| 9,479,453 | B2 | 10/2016 | Yousefi et al. | |
| 9,565,552 | B2* | 2/2017 | Mohammed | H04W 4/24 |
| 9,626,198 | B2* | 4/2017 | Hess | B60K 37/00 |
| 2005/0090907 | A1* | 4/2005 | Hudson | G05B 19/0421 700/3 |
| 2007/0291765 | A1* | 12/2007 | Boley | H04L 47/10 370/395.21 |
| 2008/0201490 | A1* | 8/2008 | Quackenbush | H04L 29/06 709/247 |
| 2011/0128118 | A1* | 6/2011 | Gilleland | B60R 25/24 340/5.2 |
| 2011/0234427 | A1* | 9/2011 | Ingram | G08G 1/20 340/995.1 |
| 2012/0109446 | A1* | 5/2012 | Yousefi | G06F 1/26 701/29.3 |
| 2012/0320928 | A1* | 12/2012 | Takada | H04L 69/04 370/401 |
| 2013/0262703 | A1* | 10/2013 | Dong | H04L 47/38 709/247 |
| 2014/0129688 | A1* | 5/2014 | Asenjo | H04L 41/046 709/221 |
| 2014/0303807 | A1* | 10/2014 | Addepalli | H04W 48/18 701/1 |
| 2015/0312125 | A1* | 10/2015 | Subramanian | H04L 43/0876 709/224 |
| 2016/0021070 | A1* | 1/2016 | Wagner | G08G 1/0112 726/4 |
| 2016/0127513 | A1* | 5/2016 | Fallon | H04L 12/1895 709/247 |
| 2016/0359760 | A1* | 12/2016 | Vishnyakov | H04L 47/2483 |
| 2017/0236419 | A1* | 8/2017 | Grewe | G08G 1/161 340/870.07 |
| 2018/0127001 | A1* | 5/2018 | Ricci | B60W 40/09 |

OTHER PUBLICATIONS

Salomon, David., "Data Compression—The Complete Reference", Fourth Edition, 1092 pages, 2007, Springer-Verlag London.

* cited by examiner

| ENDPOINT 710 | IP ADDRESS 720 | INFORMATION 730 |
|---|---|---|
| EP1 | IP1 | "INFO 1" |
| EP2 | IP2 | "INFO 2" |
| ... | ... | ... |
| EPN | IPN | "INFO N" |

MIXED QUALITATIVE, QUANTITATIVE SENSING DATA COMPRESSION OVER A NETWORK TRANSPORT

RELATED APPLICATION

This application claims priority to U.S. Provisional Application No. 62/461,070, filed on Feb. 20, 2017, entitled "MIXED QUALITATIVE, QUANTITATIVE SENSING DATA COMPRESSION OVER A NETWORK TRANSPORT," by Maluf, et al., the contents of which are incorporated herein by reference.

TECHNICAL FIELD

The present disclosure relates generally to computer networks, and, more particularly, to mixed qualitative and quantitative sensing data compression over a network transport.

BACKGROUND

In recent years, the amount and type of data collected by cloud-based services and data centers from edge devices has been increasing significantly. This is particularly true in the case of edge devices such as passenger and commercial vehicles. For example, a vehicle of the future may produce multiple terabytes (TBs) of data per day. However, many existing gateways do not support the size requirements of this additional data. Notably, a typical mobile gateway operates over an LTE connection at the lower Megabits range speed. For example, consider a Lidar sensor in a vehicle that produces over 2 TB of data per day. In such a case, it would be impractical to transmit this data over an existing Gigabit switch.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 7 illustrates an example view of a shared listing of IP address assignments for network virtualization of serial network endpoints;

DESCRIPTION OF EXAMPLE EMBODIMENTS

Overview

Figure 1A:
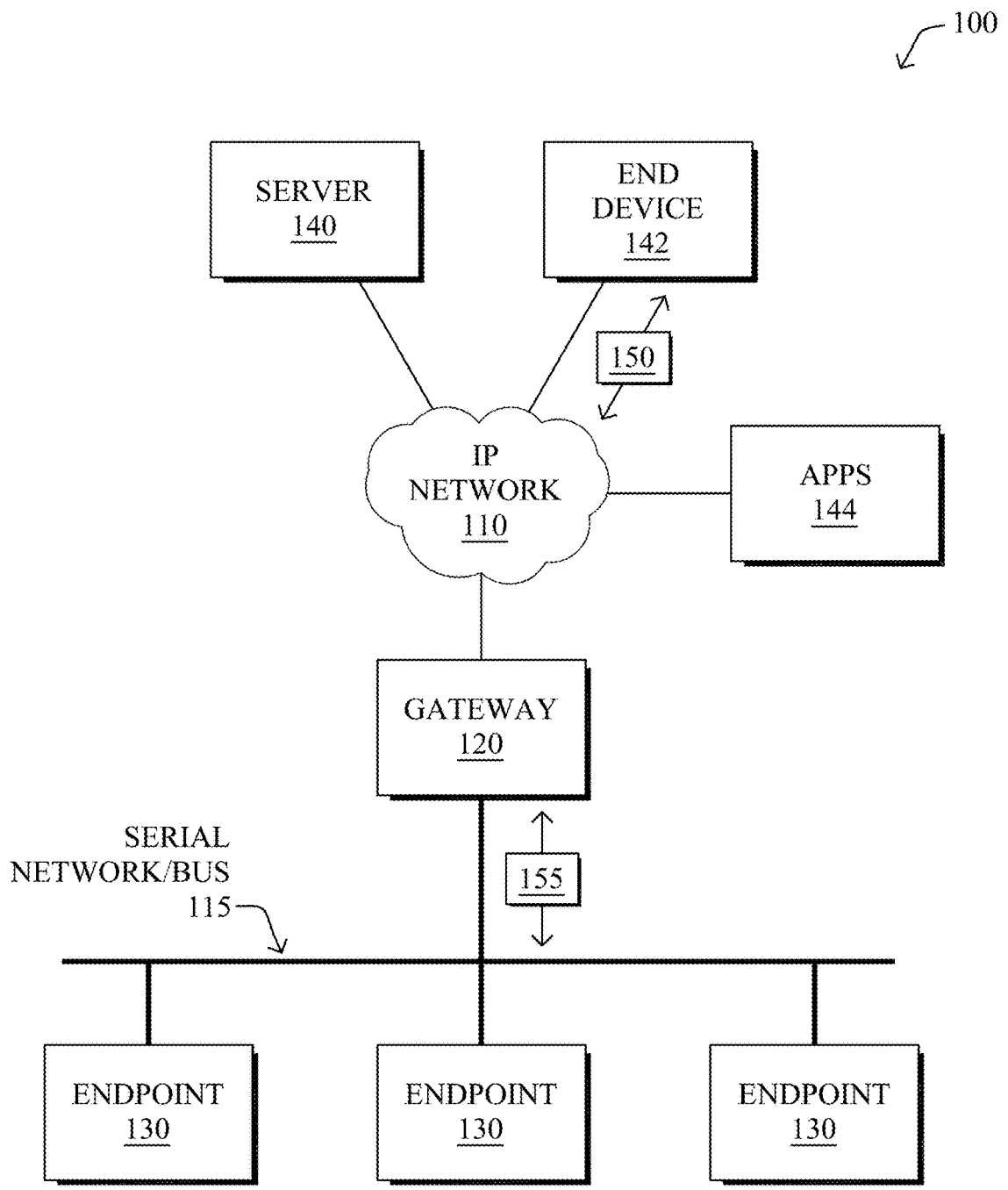
FIGS. 1A-1B illustrate an example communication system.

According to one or more embodiments of the disclosure, a device in a serial network de-multiplexes a stream of traffic in the serial network into a plurality of data streams. A particular one of the data streams is associated with a particular endpoint in the serial network. The device determines that data from the particular data stream associated with the particular endpoint should be reported to an entity external to the serial network based on an event indicated by the data from the particular data stream. The device quantizes the data from the particular data stream. The device applies compression to the quantized data to form a compressed representation of the particular data stream. The applied compression is selected based on a data type associated with the data. The device sends a compressed representation of the particular data stream to the external entity as Internet Protocol (IP) traffic.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, and others.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or power-line communication (PLC) networks. That is, in addition to one or more sensors, each sensor device (node) in a sensor network may generally be equipped with a radio transceiver or other communication port, a microcontroller, and an energy source, such as a battery. Often, smart object networks are considered field area networks (FANs), neighborhood area networks (NANs), etc. Generally, size and cost constraints on smart object nodes (e.g., sensors) result in corresponding constraints on resources such as energy, memory, computational speed and bandwidth.

Networks may also be, or may include, an "Internet of Things" or "IoT" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

Serial networks are another type of network, different from an IP network, typically forming a localized network in a given environment, such as for automotive or vehicular networks, industrial networks, entertainment system networks, and so on. For example, those skilled in the art will be familiar with the on-board diagnostics (OBD) protocol (a serial network which supports a vehicle's self-diagnostic and reporting capability, including the upgraded "OBD II" protocol), the controller area network (CAN) bus (or CAN-BUS) protocol (a message-based protocol to allow microcontrollers and devices to communicate with each other in applications without a host computer), and the MODBUS® protocol (a serial communications protocol for use with programmable logic controllers, such as for remote terminal units (RTUs) in supervisory control and data acquisition (SCADA) systems). Unlike an IP-based network, which uses a shared and open addressing scheme, a serial communication network generally is based on localized and proprietary communication standards, where commands or data are transmitted based on localized device identifiers, such as parameter identifiers (PIDs), localized station addresses, and so on.

FIG. 1A illustrates an example communication system 100 illustratively comprising an Internet Protocol (IP) network 110 and a serial network/bus 115, along with a gateway (or other network device) 120 interconnecting the two networks, as described in greater detail below. Serial network 115, in particular, illustratively comprises one or more endpoints 130 (e.g., a set of one or more controlled devices, sensors, actuators, controllers, processors, and so on), such as part of a vehicular network, an industrial network, etc. The endpoints may be interconnected by various methods of serial communication. For instance, the serial network/bus 115 may allow the endpoints 130 to communicate serial data 155 (e.g., commands, sensor data, etc.) using predefined serial network communication protocols (e.g., OBD, CAN-BUS, MODBUS®, etc.). In this context, a serial network protocol consists of a set of rules defining how the endpoints interact within the serial network 115.

IP network 110, on the other hand, illustratively comprises links interconnecting one or more devices through a network of routers or switches. For example, a set of one or more servers (or controllers) 140, one or more end devices (e.g., user devices, workstations, etc.) 142, and one or more other application devices 144 may be interconnected with the IP network 110. The devices, generally, may be interconnected by various methods of IP-based communication. For instance, the links may be wired links or shared media (e.g., wireless links, PLC links, etc.) where certain devices may be in communication with other devices, e.g., based on distance, signal strength, current operational status, location, etc. IP data packets 150 (e.g., traffic and/or messages sent between the devices/nodes) may be exchanged among the nodes/devices of the IP network 110 using predefined IP network communication protocols such as the transmission control protocol (TCP), TCP/IP, user datagram protocol (UDP), or other protocols where appropriate. In this context, an IP network protocol consists of a set of rules defining how the nodes interact with each other over the IP network 110.

As described below, the gateway device 120 illustratively bridges both the IP network 110 and serial network 115, and as such may be considered to be a part of either or each network, accordingly. Further, those skilled in the art will understand that any number of nodes, devices, links, endpoints, etc. may be used in the computer system 100, and that the view shown herein is for simplicity. Also, those skilled in the art will further understand that while the system is shown in a certain orientation, system 100 is merely an example illustration that is not meant to limit the disclosure.

Figure 1B:
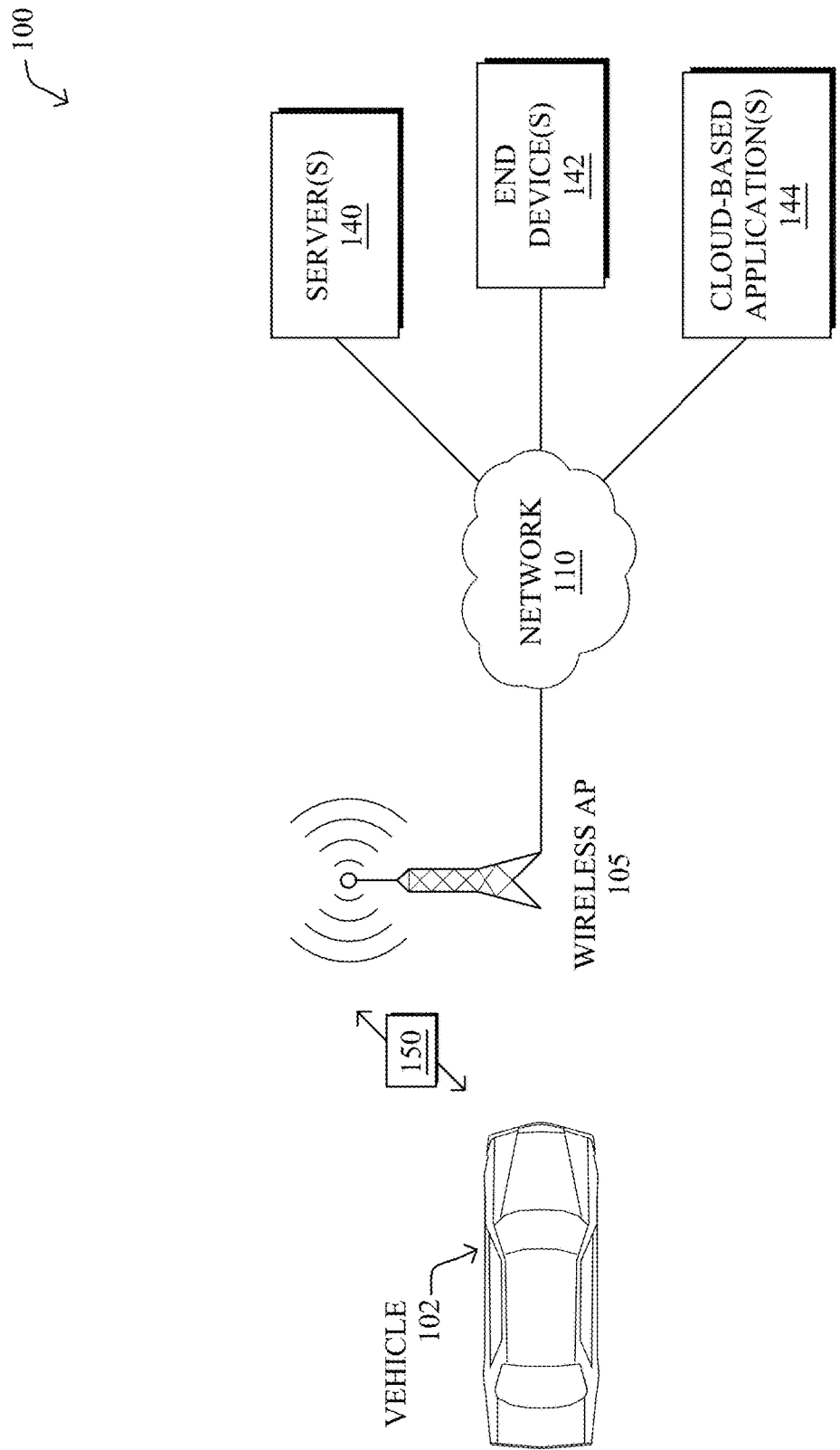

FIG. 1B illustrates one potential implementation of communication system 100, according to various embodiments. As shown, assume that system 100 includes a vehicle 102 in which serial network/bus 115 and gateway 120 are located. For example, many passenger vehicles now include a CAN-Bus-based serial network that connects any number of endpoint sensors and/or actuators (endpoints 130). To connect the serial network 115 of vehicle 102 to IP network 110, gateway 120 resident on vehicle 102 may communicate remotely with a wireless access point (AP) 105. For example, vehicle 102 may be in remote communication with a cellular transceiver, Wi-Fi hotspot, or the like, to connect vehicle 102 with network 110. In further embodiments, vehicle 102 may instead be in communication with network 110 via a wired connection. For example, vehicle 102 may be connected to network 110 during charging (e.g., in the case an electric or hybrid electric vehicle), storage, repair, or the like.

Figure 2:
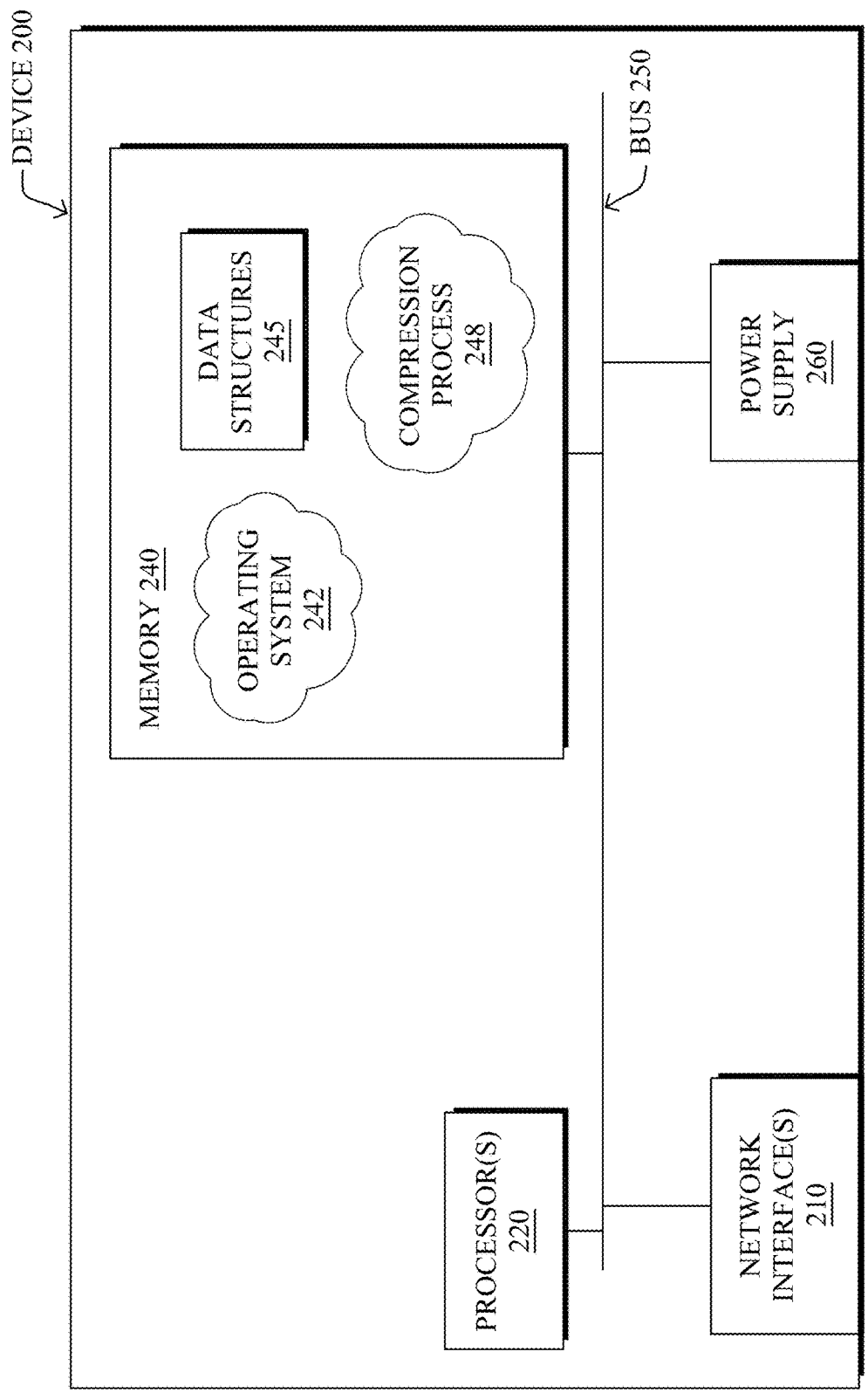
FIG. 2 illustrates an example network device/node.

FIG. 2 is a schematic block diagram of an example node/device 200 that may be used with one or more embodiments described herein, e.g., as any of the nodes/devices shown in FIG. 1 above, particularly as the gateway device 120 as described herein. The device may comprise one or more network interfaces 210 (e.g., wired, wireless, PLC, etc.), at least one processor 220, and a memory 240 interconnected by a system bus 250, as well as a power supply 260 (e.g., battery, plug-in, etc.).

Network interface(s) 210 include the mechanical, electrical, and signaling circuitry for communicating data over links coupled to the IP network 110 and/or serial network 115. The network interfaces 210 may be configured to transmit and/or receive data using a variety of different IP communication protocols, such as TCP/IP, UDP, etc. Note that the device 200 may have multiple different types of IP network connections 210, e.g., wireless and wired/physical connections, and that the view herein is merely for illustration. Also, while the IP network interface 210 is shown separately from power supply 260, for PLC the network interface 210 may communicate through the power supply 260, or may be an integral component of the power supply.

In some specific configurations the PLC signal may be coupled to the power line feeding into the power supply.

In further embodiments, network interface(s) 210 may also include the other hand, include the mechanical, electrical, and signaling circuitry for communicating data over links coupled to the serial network 115. Notably, one or more of network interface(s) 210 may be configured to transmit and/or receive data using a variety of different serial communication protocols, such as OBD, CANBUS, MODBUS®, etc., on any range of serial interfaces such as legacy universal asynchronous receiver/transmitter (UART) serial interfaces and modern serial interfaces like universal serial bus (USB).

The memory 240 comprises a plurality of storage locations that are addressable by the processor 220 and the network interfaces 210 for storing software programs and data structures associated with the embodiments described herein. The processor 220 may comprise hardware elements or hardware logic adapted to execute the software programs and manipulate the data structures 245. An operating system 242, portions of which are typically resident in memory 240 and executed by the processor, functionally organizes the device by, among other things, invoking operations in support of software processes and/or services executing on the device. These software processes/services may comprise an illustrative compression process 248, as described herein. Note that while process 248 is shown in centralized memory 240 alternative embodiments provide for the process to be specifically operated within the network interface(s) 210.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Many serial network endpoints, such as sensors and actuators found in vehicular or industrial systems, are specifically tailored to function based on a proprietary serial communication protocol. Typically, such endpoints are also not natively enabled for IP communication. That is, in many serial network implementations, the commands and data consumption for the endpoints occurs on a device that is also a part of the serial network.

As noted above, there are many instances in which telemetry data from endpoints of a serial network may be useful to an external entity. For example, in the case of vehicles, telemetry data from the various sensors of the vehicle may be leveraged by an external entity (e.g., a remote service provided by the manufacturer of the vehicle, etc.) for purposes of diagnostics, safety, and the like. However, even with a mechanism in place to covert the serial network traffic into IP traffic, further challenges remain including the following:

It will be prohibitively expensive for an external entity (e.g., data center, cloud service, etc.) to collect all of the generated data for the monitored device/system (e.g., vehicle, industrial equipment, etc.).

Real time telemetry streaming would require significant backhauls of service provider networks.

Modern sensors/data would require even more bandwidth.

Mixed Qualitative, Quantitative Sensing Data Compression Over a Network Transport The techniques herein also introduce qualitative measures into quantitative compression approaches and optimize data flow compression further over a network. In some aspects the techniques herein redefine a data flow, allowing for end-to-end optimization of the data flow telemetry over a network transport from the edge points. For example, one use cases of the techniques herein allows for the collection and transport of telemetry in commercial and passenger vehicles to an external entity that is remote to the vehicle. More specifically, the techniques herein introduce a model-based, programmable, intelligent compression mechanism that is analytically driven. Further, the techniques herein allow for the segregation of the various data present in the serial network into unique telemetry streams that can be analyzed and compressed separately. By segregating the data in the serial network into different data streams, the techniques herein allow the data to be locally selected, filtered, quantized, and/or transformed, prior to transport to the external entity. This processing can also be optimized for the intrinsic data types of standard telemetry, such as time series data, video, digital elevation maps, etc.

Illustratively, the techniques described herein may be performed by hardware, software, and/or firmware, such as in accordance with the compression process 248, which may include computer executable instructions executed by the processor 220 (or independent processor of interfaces 210) to perform functions relating to the techniques described herein.

Specifically, in various embodiments, a device in a serial network de-multiplexes a stream of traffic in the serial network into a plurality of data streams. A particular one of the data streams is associated with a particular endpoint in the serial network. The device determines that data from the particular data stream associated with the particular endpoint should be reported to an entity external to the serial network based on an event indicated by the data from the particular data stream. The device quantizes the data from the particular data stream. The device applies compression to the quantized data to form a compressed representation of the particular data stream. The applied compression is selected based on a data type associated with the data. The device sends a compressed representation of the particular data stream to the external entity as Internet Protocol (IP) traffic.

Figure 3A:
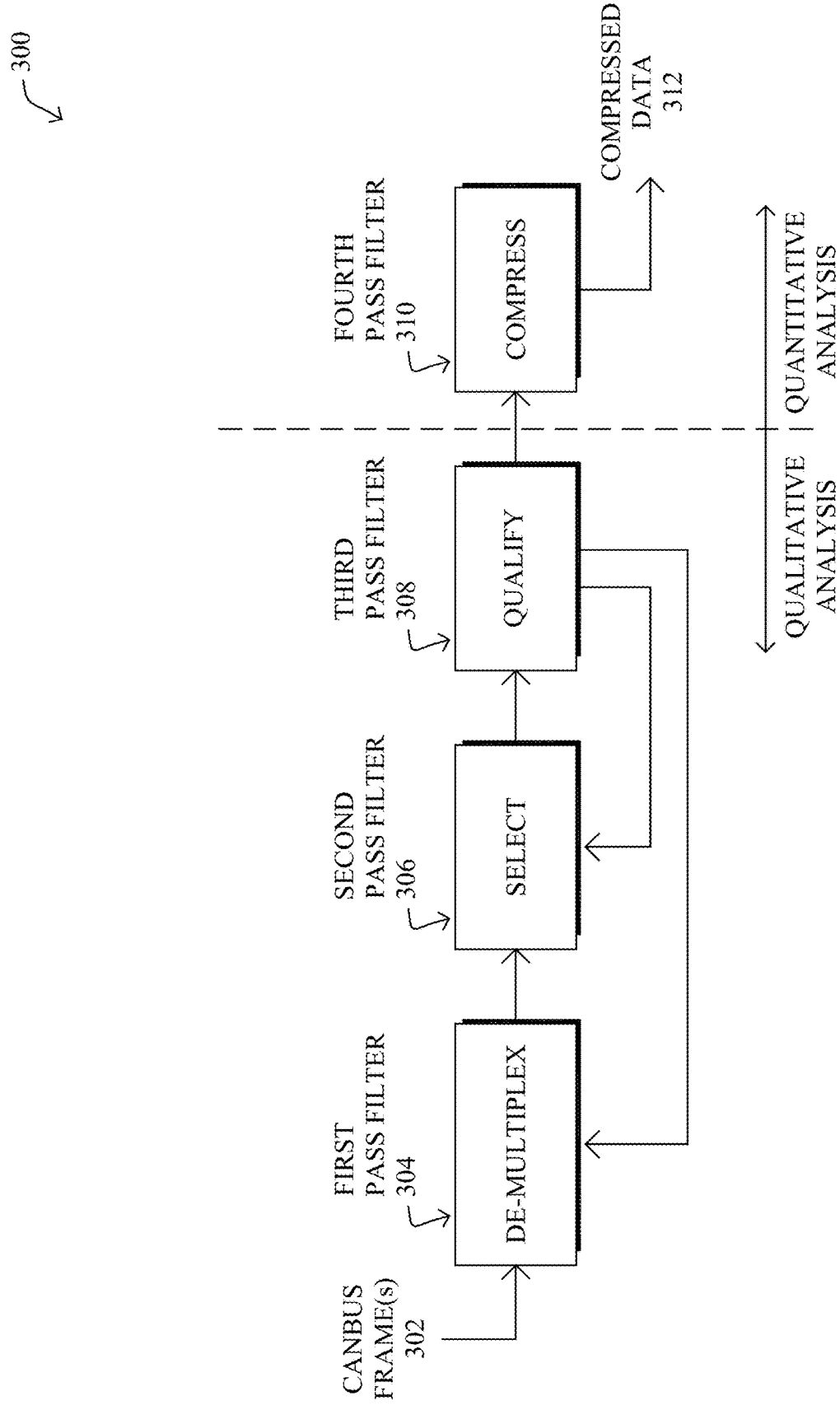
FIGS. 3A-3B illustrates an example architecture for sending compressed sensor data from a serial network.
Figure 3B:
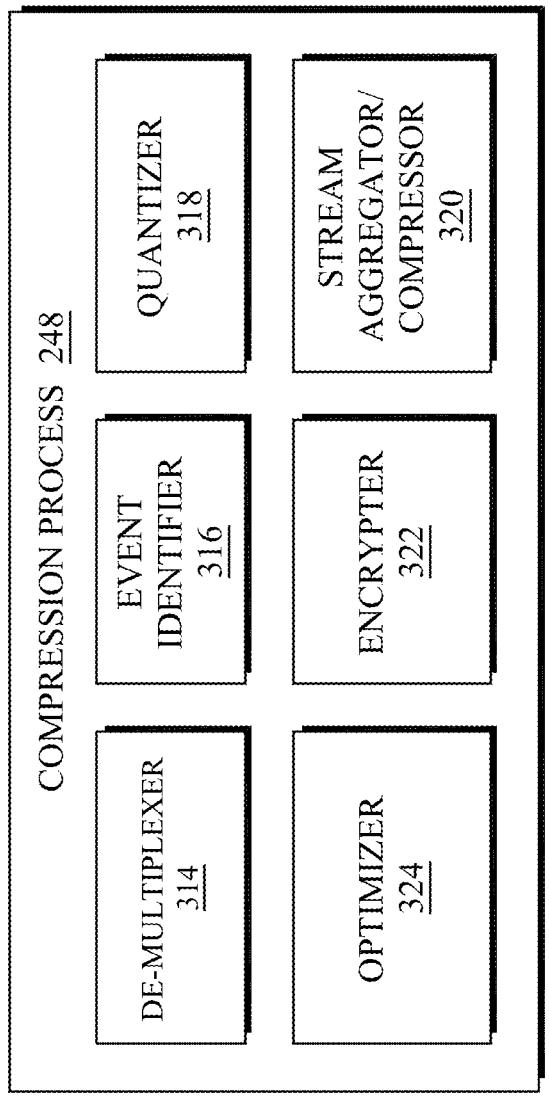

Operationally, FIGS. 3A-3B illustrates an example architecture 300 for sending compressed sensor data from a serial network, in accordance with the techniques herein. In order to fully appreciate the techniques herein, one must first have a good understanding of the data produced by a data source, such as a particular endpoint 130 show in FIG. 1A. That is, the techniques herein employ a data model upfront, to separate/segregate the data type present in the serial network. In many cases, deployed sensors are analog in nature and tend to be on an analog network in the first place, such as a MODBUS® network in industrial and manufacturing applications or a CANBUS network in automotive applications. Note also that CANBUS is not limited to just the automotive industry, but is also used for other applications as well, such as health monitoring in medical equipment, elevators, and the like.

By way of example, consider the case shown in which architecture 300 receives a CANBUS frame 302 from a CANBUS-based serial network. In such an implementation, frame 302 may be sent over an analog CANBUS, which has limited capacity based on the underlying sampling of the source sensor/endpoint. For example, in automotive applications, the highest sampling rate is defined by the CANBUS frequency. Because of this, many vehicles include multiple CANBUS-based networks, thereby allowing for the use of a high speed CANBUS for sensitive components such as the transmission of the vehicle. As would be appreciated, in a typical CANBUS frame, such as frame 302, the frame may include an identifier field that defines the ID of the data frame to be processed.

As shown in FIG. 3A, architecture 300 provides an end-to-end approach that may entail multiple passes/stages of processing with respect to frame 302, that can be viewed as a series of "filters" 304-310, in some embodiments. As a result of the processing by filters 304-310, architecture 300 may output compressed data 312 that includes a compressed representation of the original data found in frame 302 and/or a plurality of frames from the serial network.

In the first pass, e.g., a first pass filter/digitization pass by filter 304, architecture 300 may virtualize endpoints of the serial network(s). Notably, in this pass, the system may de-multiplex a data stream from a time series into a multiple stream based on the unique identifiers of each sensor ID. For CANBUS frame 302, for example, filter 304 may perform this identification on the CAN IDs or CAN Message IDs (i.e., Arbitration Field/Control) of frame(s) 302. The first pass of processing by filter 304 thus produces unique IP traffic per endpoint of the serial network. For illustrative purposes, each set of data from each IP address is referred to herein as a data stream. The IP virtualization of the serial network endpoints is described in greater detail below.

In the second pass, e.g., a second pass filter 306 may leverage policy-based payload delivery techniques, to control when, where, and how data in frame(s) 302 are reported externally. In other words, filter 306 may select which data present in the serial network is even to be reported to the external entity. For example, filter 306 may determine that a tire pressure reading from a tire pressure sensor is not a priority, allowing the system to disregard reporting of this data or, alternatively, send the data at a lowered priority.

First order analysis by filter 304 may begin by applying a Qualitative Lossy (QL) filtering mechanism that uses an arbitrary configuration, to selectively qualify and transform data readings obtained from frame(s) 302. Here, transformation of the data may entail decoding the data or applying a linear algebraic operation on the data.

Filter 306 may also process (analyze) each new data stream independently, to identify specific events from the data in the data streams. For example, filter 306 may calculate a priority event (e.g., an event that should be reported externally) by applying any number of conditions to the datagram computed from the CAN ID of frame(s) 302. In another embodiment, filter 306 may identify a priority event by applying any number of conditions on a data value from the data stream (e.g., if a temperature reading exceeds a defined threshold, etc.). In a further embodiment, filter 306 may identify a priority event by applying one or more conditions to a feedback value from third pass filter 308. Further details regarding the application of reporting policies can be found below.

In various embodiments, architecture 300 may also apply a third pass filter 308 to the individual data streams and independent of one another, to qualify and quantize the data. First order analysis by third pass filter 308 may entail application of a QL filter using an arbitrary configuration to quantize the value of the data point to one having lesser precision. For example, a temperature reading that corresponds to 170.1° Fahrenheit may be quantized to 170° Fahrenheit.

Second order analysis by filter 308 may apply a QL filter that selectively computes over an arbitrary time window any or all of the following:

Histograms;

Temporal predictions, where a data sample at time t=T is predicted based on prior data samples and general knowledge of the data (e.g., the possible value of the data is in the interval=[1,100]);

Linear transforms such as Discrete Fourier Transforms (DFT), Discrete Cosine Transforms (DCT), Wavelets signatures, etc., where the goal is to transform the data into another representation where most of the energy is concentrated in only a small fraction of the coefficients/parameters, or alternatively to look for the desired signal in the transform such looking at the value of a specific frequency in the DFT or DCT domain;

Model-based techniques. Many of the above techniques can be applied generically to different types of data. The model-based approaches involve building a model that accounts for the physical situation and attempts to predict the current data sample based on knowledge (model) of the physical situation and prior data which is used to estimate the model parameters. As a very simple example, for an electric car with regenerative braking, a model applied to predict the car's battery life or battery discharge could recognize that if the electric motor is engaged to accelerate the vehicle then the battery would be discharging. Conversely, the model could also determine that if the motor is not used and regenerative brakes are applied, then the battery would be charging. Finally, if the vehicle is coasting (i.e., neither motor nor regenerative brakes are active), the battery would likely be discharging at a low rate corresponding to the use of lights, AC, etc. This very simple example shows how it is possible to predict the polarity (positive/negative) of the battery action, thereby saving 1 bit/data sample.

By way of further example, consider a sequence of readings from a vibrational sensor [500.1, 500.2, 500.3] psi over the course of 100 milliseconds. In such a case, filter 308 may compute a DCT or histogram sequence based on these readings. In contrast, a sequence of temperature sensor readings may result in a histogram computation. In other words, the specific approach taken by filter 308 may depend on the specific type of data being processed.

Another defining aspect of filter 308 may be its application of an arbitrary configuration, to choose the degree of precision of the above approaches (e.g., histogram signature, temporal prediction, transformation, model, etc.). In turn, filter 308 may generally quantize the resulting parameters using either a scalar or vector quantizer, where the attributes of the quantizer, and resulting distortion, is configured to maximize the performance of the system. For example, if there are two temperature readings and the first needs higher accuracy than the second, then a vector quantizer can be applied where the quantizer for the first parameter is finer than for the second, e.g., the first temperature parameter may be quantized to the nearest degree, while the second to the nearest even degree.

In various embodiments, the output of filter 308 may produce an atomic datagram that can be fed to the first pass filter 304 as a new stream, fed as input to the second pass filter 306 for further selection and rule analysis, and/or sent as input to fourth pass filter 310 for compression. Note that the feedback from third pass filter 308 may be a key feature in many implementations to improve the overall success of the compression mechanism.

Architecture 300 may also include a fourth pass filter 310 that compresses the quantized data from third pass filter 308, in various embodiments. In some cases, filter 310 may, for each new data stream, independently analyze and process the data, to form a compressed representation of the original data from frame(s) 302. Notably, based on the nature of the data type historically know to underlying sensor (e.g., vibration sensor, pressure sensor, etc.), filter 310 may establish the context of use for the data type, to identify and understand the most efficient quantitative compression approach for that stream.

Example quantitative filters that filter 310 may apply include, but are not limited to, the following approaches:
1. Run Length Compression
2. Huffman Encoding
3. Arithmetic Coding
4. Adaptive Arithmetic Encoding—Context Modeling. Adaptive entropy coding techniques often provide the best performance as they identify and leverage the dynamic (time-varying or changing) characteristics of the data to maximize performance. For example, adaptive arithmetic coding with context modeling learns the characteristics of the signal (such as the time-varying probability density function of the parameter to be encoded) and then entropy codes the signal based on that adaptive model. This can lead to significant improvements in compression performance without losses in performance. Furthermore, if there are multiple different types of data to compress, the adaptive arithmetic encoding with context modeling can include a context model for every type of data and then switch to the appropriate context model as it receives each data type to encode. In addition, only a single adaptive entropy coder is required to code different types of data, and it simply selects from multiple contexts models based on the specific data to encode at each point in time.

As noted above, the context and data type may also factor into how the data is compressed. In various embodiments, the compression may be based on a model for the data. Notably, in some cases, the model itself and statistics regarding the observed stream can be sent to the receiver, instead of the raw data of the stream. In turn, the receiver can then recover the data of the stream using the model and the stream statistics. To form such a model, a moving time or sample window can be used on a given stream and the results for each window processed using a data transformation, such as a Fourier transformation, other time series transformations, or the like. In another embodiment, Kalman filters (i.e., Bayesian statistics) can be leveraged for model estimation. In yet another embodiment, Lidar compression can be used to form one or more Digital Elevation Maps (DEMs) and corresponding statistics (e.g., an associated covariance matrix for a DEM), which can then be sent to the receiver instead of the raw stream data. Note also that any computations made for a given time or sample window can also be quantized again, in some embodiments.

By assessing the specific data type(s) and context(s), this allows the system to control which compression approach is applied. More specifically, the serial network traffic can be demultiplexed into multiple data streams that are then compressed based on their contents and, if correlated, can even be coded together during compression. For example, assume that four of the data streams correspond to tire sensor readings, such as pressure or temperature. In such a case, this data may be correlated across the four tires. By leveraging this correlation, despite there being four separate data flows of sensor information, after the value from the first tire sensor is encoded, the values for the remaining tire sensors can be encoded predictively based on the value from the first tire sensor. Similarly, if there are one hundred batteries in the vehicle, instead of coding the values of each battery separately (e.g., charge, etc.), they can be encoded predictively.

Various compression approaches can be taken to encode any number of video streams in the serial network. For example, a given vehicle may be equipped with a plurality of video cameras and/or millimeter (mm) wave radars that have overlapping viewpoints. The system can thus leverage this overlap by jointly encoding these camera views, as opposed to coding them individually. By exploiting the correlations that may exist across different data streams, the total required data rate can be reduced (e.g., when sending data to a location that is remote from the serial network) and the compression can be viewed as being joint or stateful across the multiple data streams.

With respect to the use of predictive models for purposes of compression, the coded information may be sent to a receiver that also has a model that can be used to predict the data. In this case in FIG. 3A, for example, the compression can be performed by the sender incorporating the same prediction model that the receiver has and only sending the error in the resulting prediction. In turn, the receiver can then use this error signal and add it to the prediction, to determine the value at the sender. In some cases, the receiver may actually send the prediction (or the model) to the sender, to be used in performing the prediction. For example, consider the case in which the system is to send the maximum charging capacity of each battery in a vehicle. This charging capacity may decay over time and use, making it a useful measurement for system performance and to determine the total maximum charging capacity for the vehicle. By having a model of the maximum charge capacity (e.g., a truncated Gaussian probability distribution with mean of X and variance of Y, and cut off with a max of M), then this information can be used to improve the coding efficiency. This model could either be available a priori and applied at the sender and receiver, or the receiver may generate this model and send it to the sender. In other cases, the receiver and sender may a priori have the same parameterized model (truncated Gaussian) but the receiver will send the sender the parameter values (e.g., X, Y, and M).

As a result of the selected compression, architecture 300 is able to output a compressed form of the data from frame(s) 302 for consumption by an external entity, such as a server in a data center, cloud-based service, application, etc. Notably, the resulting compressed data 312 can be sent via an IP network as IP traffic to the external entity, either on a pull or push basis. In further embodiments, encryption may also be applied to the IP traffic, to secure the transmitted data from interception by malicious third-parties.

FIG. 3B illustrates one potential implementation of architecture 300 within compression process 248. As shown, compression process 248 may include any number of sub-processes and/or may access any number of memory locations. As would be appreciated, these sub-processes and/or memory locations may be located on the same device or implemented in a distributed manner across multiple devices, the combination of which may be viewed as a single system/device that executes compression process 248 process 248. Further, while certain functionalities are described with respect to the sub-processes and memory locations, these functions can be added, removed, or combined as desire, in further implementations.

One potential sub-process of compression process 248 is a de-multiplexer 314 that is configured to de-multiplex the data streams from the various endpoints in the serial network. Notably, de-multiplexer may assess the identifiers in the various frames on the serial bus, to associate the data with a particular one of the endpoints in the serial network. For example, de-multiplexer 314 may assess CANBUS frames on the serial network, to aggregate temperature readings from a particular temperature sensor into a stream of data associated with that sensor. In some embodiments, de-multiplexer 314 may also treat these data streams as virtualized IP traffic flows, as detailed below.

Another sub-process of compression process 248 is an event identifier 316. In general, event identifier 316 may be configured to assess the data in a given data stream for an endpoint, to determine whether and/or how the data should be reported to the external entity outside of the serial network. For example, event identifier 316 may assess the identity of the endpoint itself, the raw reported data from the endpoint, the post-processed data associated with the endpoint, or the like, to determine whether a priority event has occurred. Compression process 248 may then use this information to control whether the data stream requires further processing (e.g., no processing may be needed, if the data is not to be reported) and control the priority of its reporting, as detailed further below.

Compression process 248 may also include a quantizer 318 that is configured to quantize the data in the data stream. For example, quantizer 318 may compute one or more of: a histogram of the data from the particular data stream, a linear transformation of the data from the particular data stream (e.g., wavelet, DCT, etc.), or a predictive model using the data from the particular data stream. Generally, quantizing is a lossy process in that some information may be lost (e.g., by dropping the decimals from a temperature reading, in a simple case, etc.), but also serves to reduce the overall size requirements of the data, as well. In some cases, quantizer 318 may select the quantization approach based on the type of data in the data stream. In various embodiments, this quantized data may also be used as part of a feedback loop, such as by having de-multiplexer 314 and/or event identifier 316 re-process the output of quantizer 318 any number of times.

Compression process 248 may further include a data stream aggregator/compressor 320 operable to aggregate and compress the quantized data from quantizer 318. In some embodiments, compressor 320 may apply a compression approach based on the type or context of the data in the data stream. Example compression methodologies that compressor 320 may apply can include, but are not limited to, run-length encoding, Huffman encoding, arithmetic encoding, or adaptive arithmetic encoding. As a result, an output of compressor 320 may be a compressed representation of the original data (as quantized by quantizer 318), which is significantly reduced in size from that of the original data set.

In some cases, compression process 248 may further include an encrypter 322 that is configured to encrypt the compressed data from compressor 320 during transport. For example, encrypter 322 may utilize Transport Layer Security (TLS) encryption, or another security mechanism, to ensure that the compressed data sent to the external entity is not intercepted by a third-party, such as a hacker or other malicious entity.

Compression process 248 may also include an optimizer 324 configured to optimize the reporting of the compressed data to the external entity across different data streams (e.g., from different endpoints). For example, optimizer 324 may apply any number of rules based on the endpoint, results from event identifier 316, data type, etc., to queue the data for transport using expedited, assured, or best effort transport approaches. In turn, optimizer 324 may also schedule when the various data packets are sent to the external entity, to form a stream of IP traffic to the external entity.

By way of a use case example, in the context of in-vehicle networks, automobile manufactures are including a larger number and greater diversity of sensors, including radar, ultrasonic, RGB and infrared cameras, LIDAR, etc. Some of the associated raw signals produced by these sensors are in the many Gb/s range, e.g., a 4 k cameras produce approximately 4 k×2 k pixels per frame at 60 frames per second which corresponds to (4000×2000 pixels/frame)×(24 bits/pixel)×(60 frame/s)=11.5 Gb/s raw data rate. If the vehicle were to send this data uncompressed, it would require a 20 or 40 Gb/s network within the car, which would be prohibitively expensive in many cases. However, by using the compression techniques herein, the sensed signals can be effectively "squeezed" into a 1 Gb/s or even a 100 Mb/s network link, while preserving all of the information required for the external entity to make accurate decisions regarding the reported data.

Figure 4A:
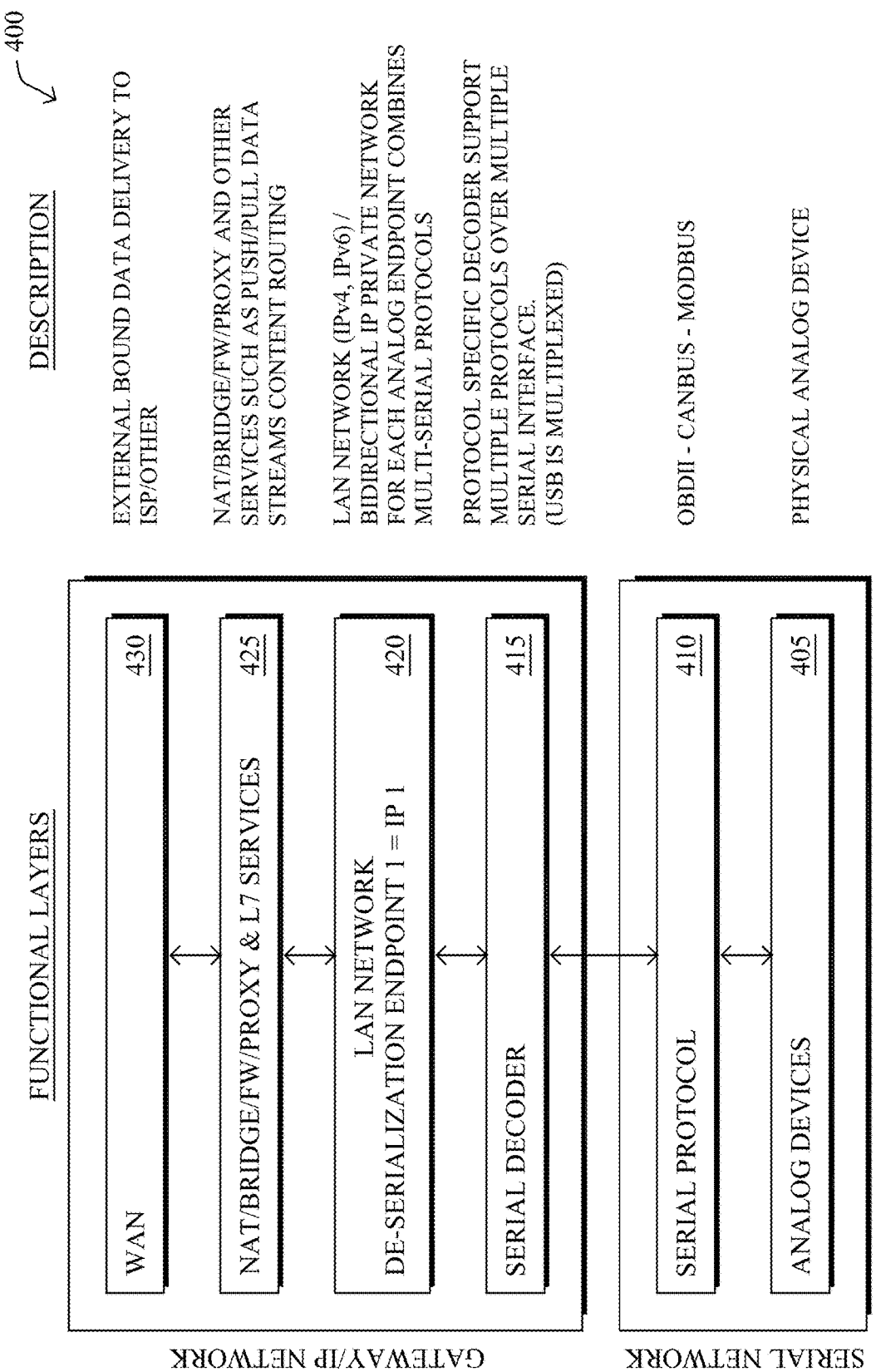
FIGS. 4A-4B illustrate example views of Internet Protocol (IP) network virtualization of serial network endpoints within an example automotive serial network.
Figure 4B:
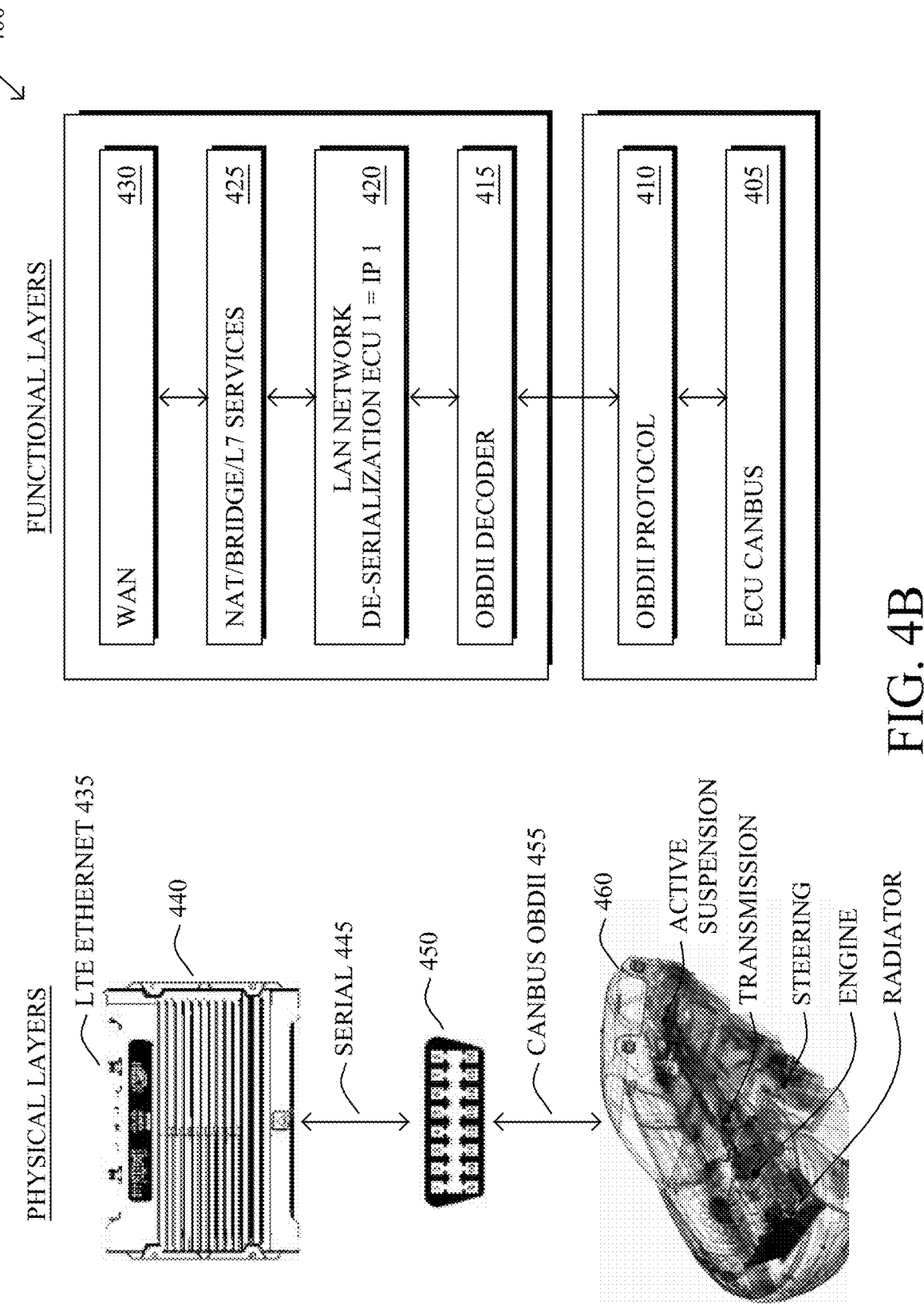

FIGS. 4A-4B illustrate example views of Internet Protocol (IP) network virtualization of serial network endpoints within an example automotive serial network. With reference to FIG. 4A, and as described in greater detail below, illustrative functional layers 400 of IP network virtualization of serial network endpoints according to the techniques herein are shown. In particular, the serial network consists of one or more analog device 405 (endpoints 130) communicating using a serial protocol 410. The serial decoder 415 (e.g., de-multiplexer 314 of compression process 248) translates between the serial protocol 310 and an IP network/LAN 420 (IPv4, IPv6, etc.). Once on the IP network, the traffic receives the benefit of IP services 425, such as network address translation (NAT), bridging, firewalling, proxying, and other services such as push/pull data streams and content routing. In this manner, the IP traffic may reach a WAN 430 (e.g., the Internet or other IP-based network), thus providing external bound data delivery to an Internet Service Provider (ISP) or other network.

As a simple example, FIG. 4B illustrates a use case for an automotive/vehicular network, where a gateway 440 (e.g., device 200) communicates over an IP network link 435, e.g., Ethernet or LTE (cellular), as well as over a serial link 445, such as to a serial port 450 (e.g., DLC, such as an OBD-II port). The serial port 450 connects to the serial network 455, such as a CANBUS/OBD-II protocol network of a vehicle 460, with various serial endpoints (e.g., sensors or actuators of the suspension, transmission, steering, engine, radiator, etc.).

Figure 5:
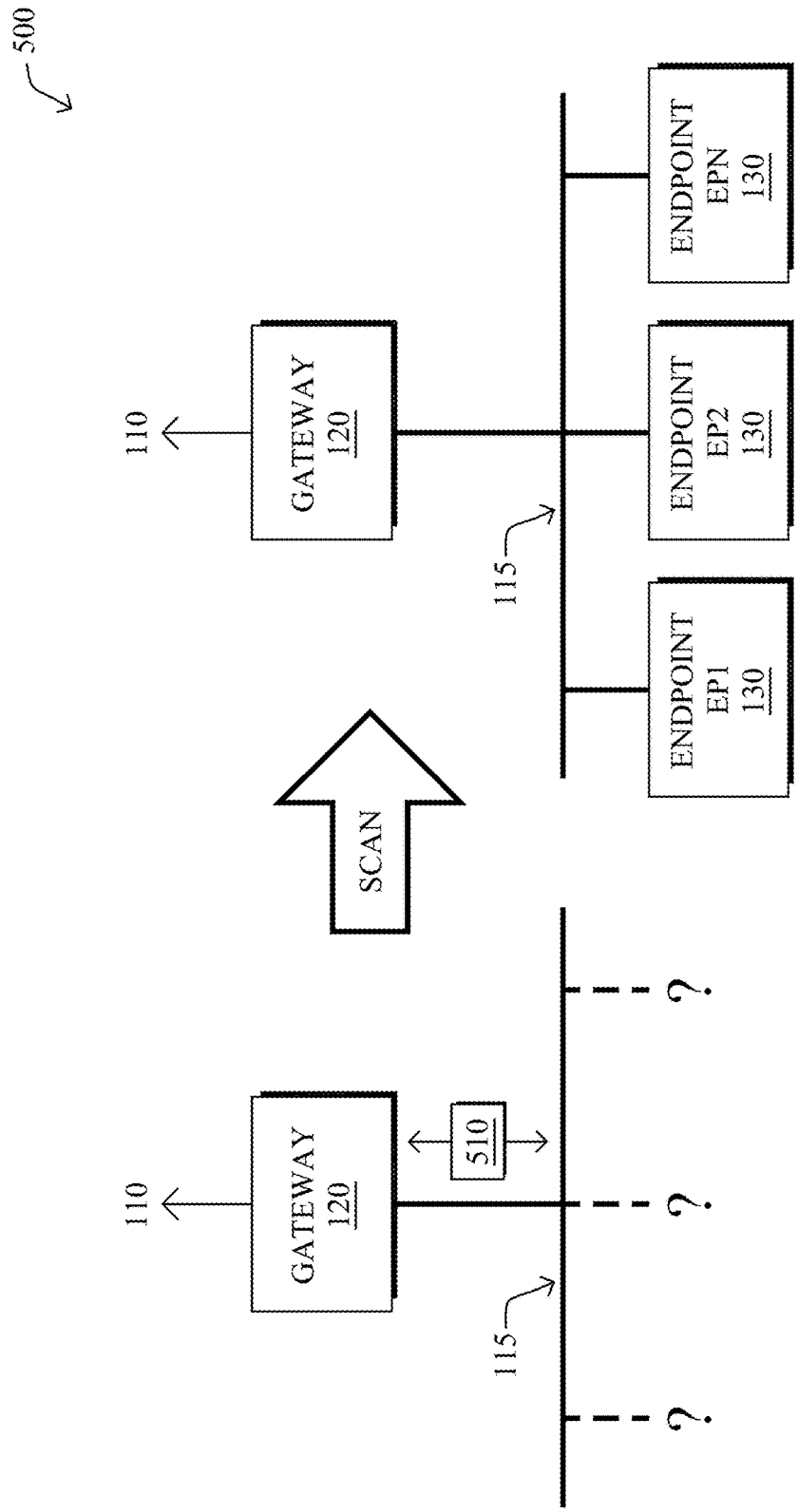
FIG. 5 illustrates an example view of scanning for serial network endpoints.
Figure 6:
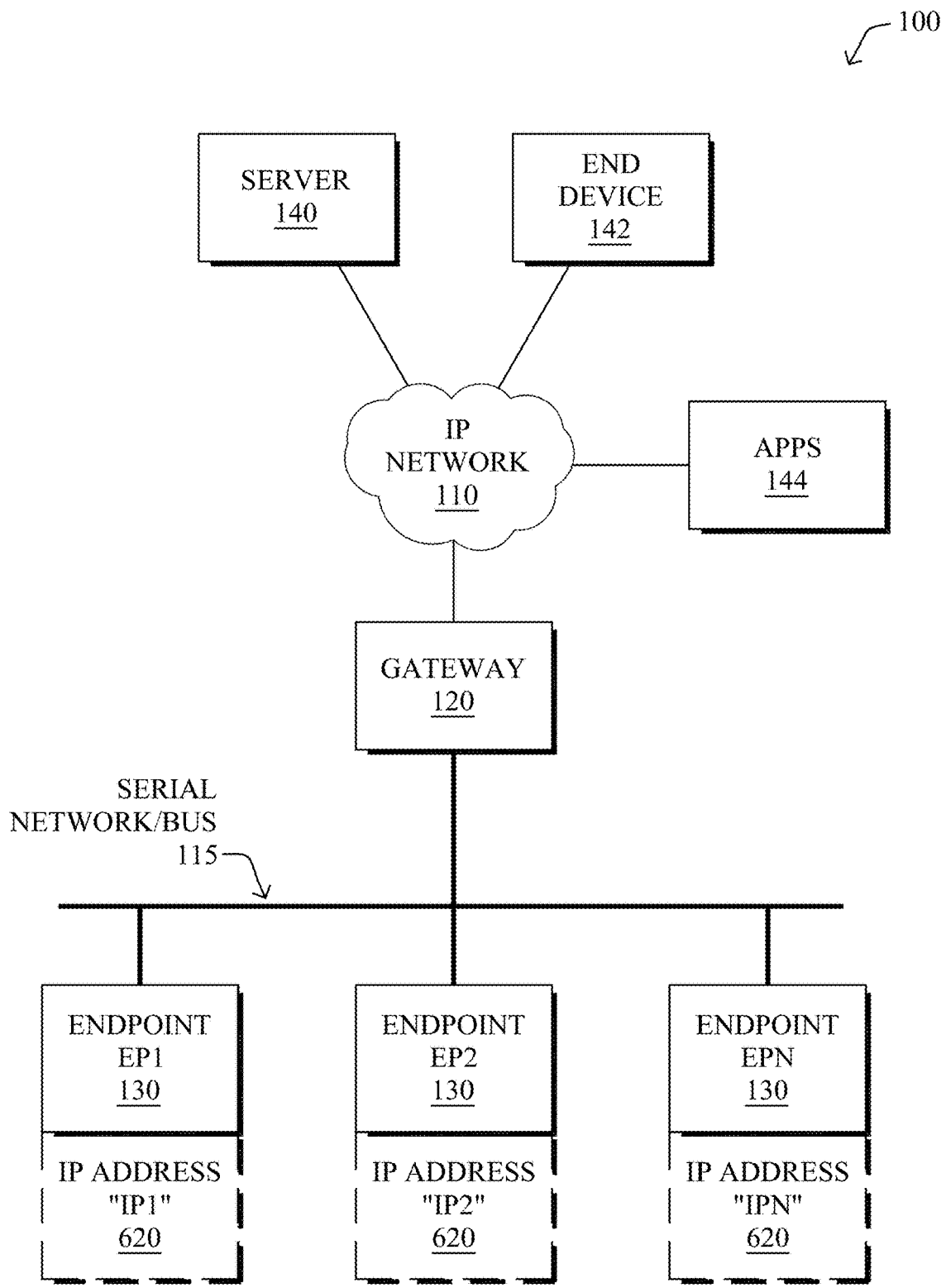
FIG. 6 illustrates an example view of IP address assignment for network virtualization of serial network endpoints.

According to the techniques herein, and with reference to FIG. 5, the embodiments begin by attempting to scan the underlying serial infrastructure based the needed protocol like OBD-II. For example, the gateway 120 may either "listen" to exchanges 510, or may initiate them (e.g., probes, requests, beacons, etc.). Once the results are received, the gateway device may thus determine the set of endpoints 130 in the serial network, such as endpoints EP1, EP2, . . . , EPN, etc. The discovered endpoints may then be processed to determine the endpoints' type, functionality, role, etc., and then referring to FIG. 6, may be virtualized into an IP-enabled LAN. That is, each endpoint 130 (EP1-EPN) discovered by the scan procedure may be dynamically allocated an IP address 620 to be associated with the endpoint such as IP1, IP2, . . . , IPN, etc. As an example, a scan for an OBD-II interface for a vehicle can result in many dozens and even hundreds of endpoints, and thus just as many corresponding new IP addresses.

Notably, the IP addresses that are assigned/allocated may be selected based on one or more policies and/or configuration mappings. For instance, an example arbitrary IPv4 address is "192.168.2.76". Since an address may be based on whether the IPs must be private or publicly addressable, the example selection of "192.168" may be based on a preset LAN mask to establish this address as private (as will be appreciated by those skilled in the art). In addition, the "2.76", on the other hand, may be arbitrary, or may specifically reflect the specific nature of the endpoint, such as type of endpoint, role, function, type of commands. Any addressing scheme may be used according to the techniques herein, such as certain types of mappings, certain number ranges, or other schemes that provide insight into the underlying endpoint (e.g., as determined by the gateway itself and advertised into the network, or else as dictated by an external control device (e.g., server) that requires specific IP addresses be assigned to particular endpoints). Note that the addressing schemes shown and mentioned in the present disclosure are merely examples that are not meant to be limited to the scope of the embodiments herein.

As shown in FIG. 7, a table (or list) 700 may keep track of the mappings from an endpoint identification 710 to an IP address 720, as well as any other relevant information 730, such as type/function/etc. of the endpoints. Information 730 may also include any other correlations or state information for endpoints, such as which server(s) may be interested in receiving data from a given endpoint, as described herein. This meta data table 700 may be created given the allocation of IP addresses to the devices given the underlying knowledge of the serial network (e.g., mapping the endpoints to specific functionality based on knowing what to expect within the serial network), as opposed to other discovery techniques (e.g., identification by the endpoints, external server lookup and/or correlation, etc.). Once the information is assembled, it may be shared with one or more interested devices in the network, such as through general advertising, unicast informing, publish/subscribe models, and so on. As an example, based on such a table 700, the following mapping and information for a set of vehicle ECUs (electronic control units) may be managed by the gateway 120 according to the techniques herein:

(-Endpoint ID 710: IP Address 720 . . . Function 730)
ECU 10: 192.168.2.110 . . . Gas;
ECU 11: 192.168.2.111 . . . Engine Temp;
ECU 12: 192.168.2.112 . . . Tire Pressure;
Etc.

In addition, informational mapping may also be maintained or otherwise derived, such as which devices to stream given information to from particular endpoints:

STREAM: 10.154.249.227/192.168.2.112—LOW PRESSURE;
STREAM 10.154.201.201/192.168.2.110—ENGINE LIGHT ON.

Figure 8:
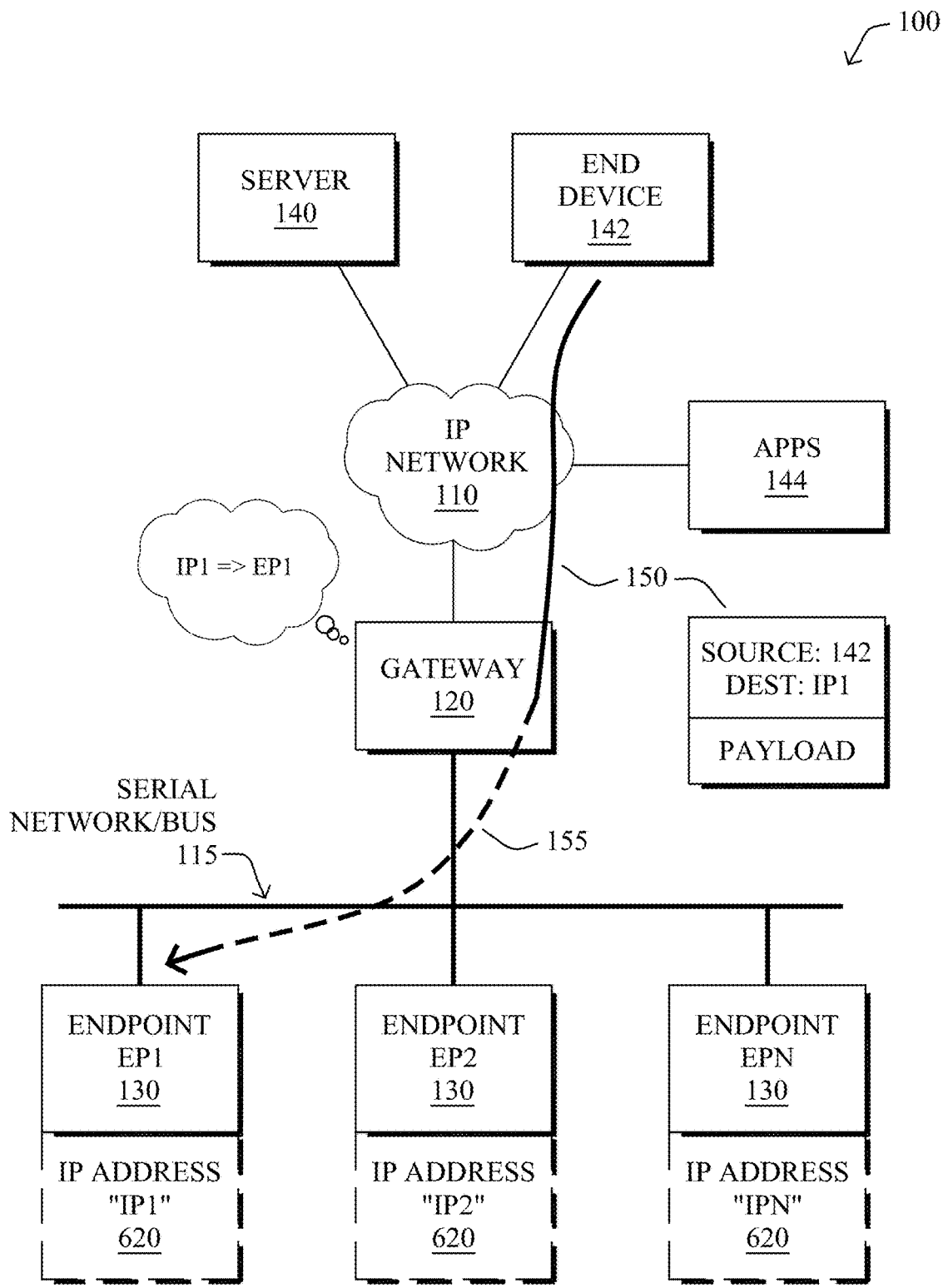
FIG. 8 illustrates an example view of mapping IP messages to serial communications for IP network virtualization of serial network endpoints.
Figure 9:
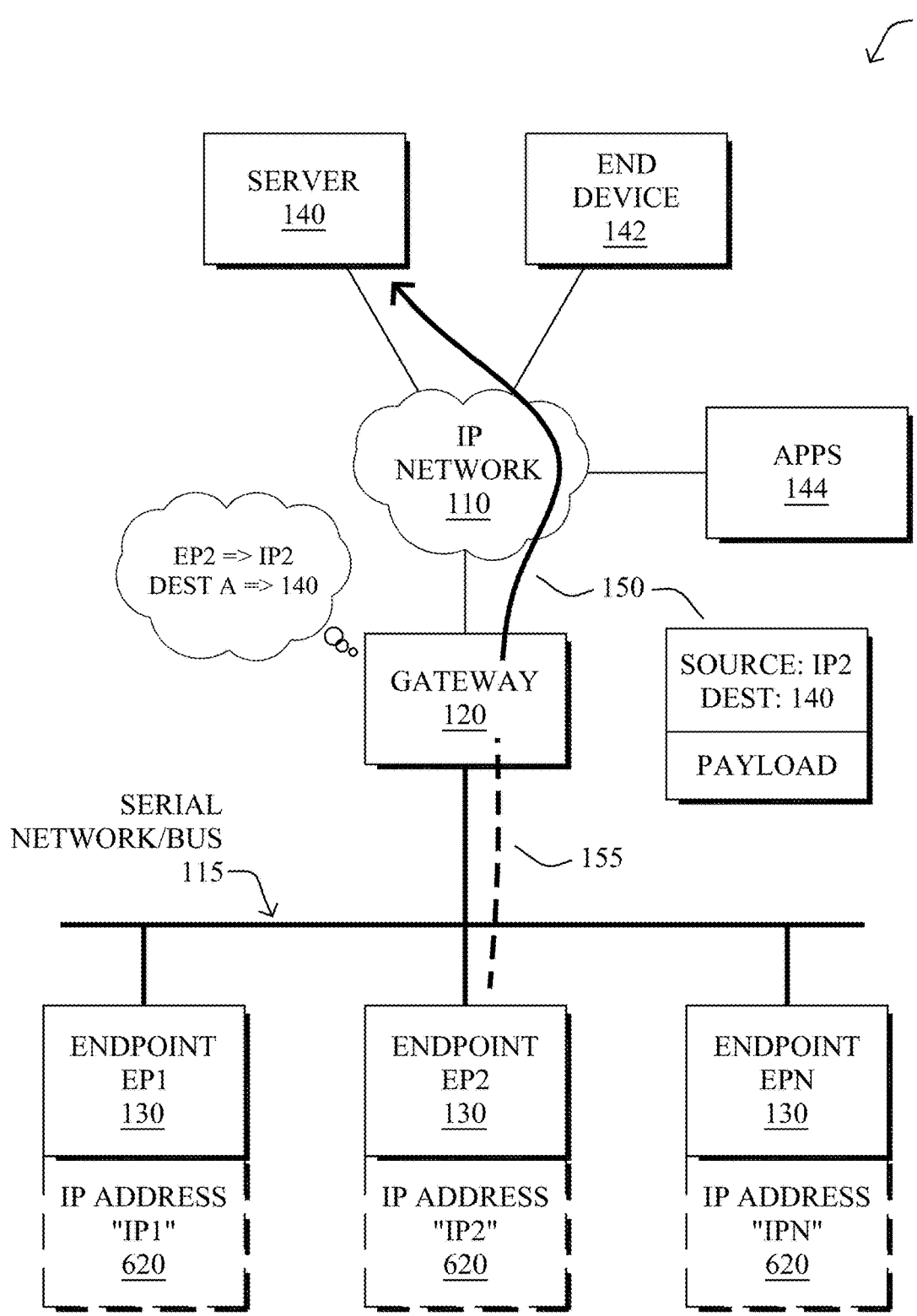
FIG. 9 illustrates an example view of bridging serial communications into IP messages for IP network virtualization of serial network endpoints.

With reference to FIGS. 8-9, the gateway 120 may act as the intermediary between IP network 110 and the serial network 115, passing messages (e.g., commands, requests, data, responses, handshakes, etc.) between the serial endpoints 130 and the IP-networked devices (e.g., 140, 142, 144, etc.). For instance, in FIG. 8, the gateway 120 may receive a command or request IP packet 150 (e.g., from end device 142) that has a destination IP address of IP1. According to the example above, the gateway 120 knows that IP1 was allocated to endpoint EP1, and as such, maps the IP message 150 into an appropriately directed serial message 155 to EP1, such as by converting the message (e.g., command/request) into the appropriate serial protocol message 155 (e.g., based on serial protocol decoder (encoder) 246.

Conversely, in FIG. 9, de-serialization from endpoint EP2 (with IP address IP2) may occur when the gateway 120 detects/receives a serial protocol message 155, and decodes the message to determine the appropriate course of action. For instance, the serial protocol message 155 may actually indicate the destination IP address for server 140, though more likely the non-IP-enabled serial endpoint can only provide an indication of the destination, such as "dest A" in an corresponding serial protocol field to indicate the intended recipient. In still other serial protocols, the endpoint provides no indication of the destination, and merely identifies itself (EP2) and its data payload. In either of these second two instances, the gateway 120 may be configured to determine the appropriate destination IP address, such as by either converting the pseudo-destination (e.g., "dest A") into an IP address for server 140, or else making a determination based on some other manner, such as maintaining state (e.g., server 140 just asked EP2 for the data), being aware of intended destinations (e.g., server 140 is always the one to receive messages or these types of messages from EP2), and so on. Note that other schemes may be used, such as publish-subscribe, multicast, broadcast, etc., where the gateway 120 can range from being a bridge between serial and IP networks, to being an active participant in the interpretation and management of the data within the passed messages. It should also be noted that the source address of the IP message 150 in FIG. 9 may be that of the gateway 120, or else may be the allocated address IP2 for endpoint EP2, depending upon the configuration of the system.

Thus, certain aspects of the end-to-end solution provided herein allows for IP virtualization within the serial network, thereby allowing the serial network traffic to be de-multiplexed into data streams for the various endpoints in the network.

Figure 10:
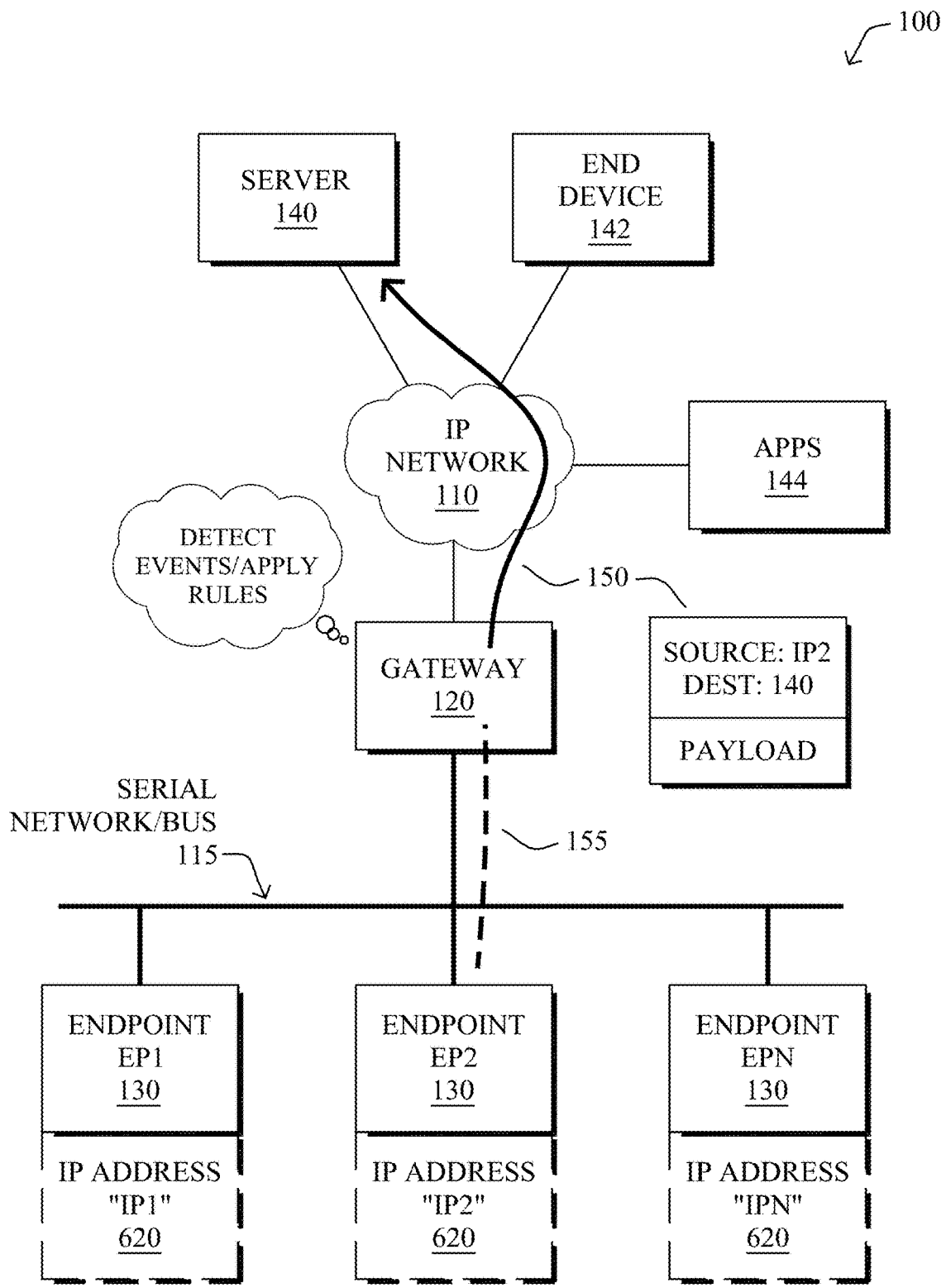
FIG. 10 illustrates an example view of applying query rules to detect events in the serial network.

FIG. 10 illustrates an example view of applying query rules to detect events in the serial network, according to various embodiments. In further aspects, the techniques herein may leverage a policy-based payload delivery mechanism, to control which data streams are actually communicated with the external entity. Such a rule can also provide mechanisms to understand, index, and search the content of the traffic streams. For example, a rule can instruct the edge network device, gateway 120, to take a variety of different actions in response to the traffic streams that match conditions in Open System Interconnection (OSI) Model Layer 3 (L3), Layer 4 (L4) and Layer 7 (L7) headers as well as packet content. Rules can also instruct gateway 120 to apply schemas to the traffic streams, so that the data can be interpreted in specific ways. Such conditions and actions are registered to the edge network device via the rules which may be generated through a standard Application Programming Interface ("API"). For example, a particular rule generated by a user through an API may cause the edge network device to deliver different parts of the same flow to different endpoint/uniform resource identifier ("URI") after optionally processing it at the edge network device. According to other examples, a rule may actuate sensors or trigger other policies if one or more of the traffic streams meet the conditions of a policy set by the rule. Additional examples of the functionality that may be embodied in rules include:

1: Applying matching criteria for L3 and L4 headers. In particular, allowing users to match on a specific value or a range of values of IP addresses and ports.
2: Placing conditions on which types of traffic are captured by the edge network device based on the L7 application specific headers. For example, a policy may request capture of a specific type of data file or video traffic of a certain encoding and/or specific resolution.
3: Conditioning the execution of certain actions on the results of user-defined queries which are run against the traffic streams. For example, a rule may impose a condition that says the traffic must be HTTP traffic, the content of the traffic is text and/or html data, and the host of the traffic is "www.serviceprovider.com." In other words, the rule may only apply to html files arriving from serviceprovider.com.
4: Specifying actions to take on the received traffic stream. Actions can include copying and delivering the entire stream, or a part thereof, to a number of specified URI endpoints, optionally preprocessing, encapsulating and/or authenticating the data using parameters specified in the rule.
5: Actions can trigger further rules, actuate other sensors, index the data, archive the data for later retrieval, periodically poll and get samples from sensors, forward the results of the query, forward the entirety of the indexed content, forward a subset of the indexed content, forward only indexed content relevant to the query results, or, if the content itself is indexed data, merge and forward the indexed results as a router function. Traffic streams can also be blocked or dropped based on the content of the received traffic streams.

In other words, the techniques described herein provide the ability to parse, index, semantically understand and search not only L3, L4 and L7 headers but also the content payload of traffic streams. These capabilities make it possible for policy-based processing of IoT and/or IoE streams whereby a rich set of actions may be carried out on matching flows, including delivery of payload content to multiple endpoints.

As would be appreciated, gateway 120 may send IP data packets 150 to the external entity either on a push or pull (e.g., in response to a query) basis. Accordingly, in some cases, gateway 120 may execute event driven actions in response to filters or patterns specified in a given query. Multiple event-driven actions can also be chained together. Examples of event-drive actions are:

GetHeader: Send original HTTP header back.
GetPayload: Send original HTTP payload back.
Syslog: Send back logging information.
GpsUpdate: Send back GPS location information upon trigger.

Timer-driven actions may be built-in actions that are not triggered by matches on queries, but are carried out at predetermined intervals. For example, an external entity may specify that at every 1000 milliseconds (1 second), gateway 120 should fetch data from the endpoint sensors 130 in network 115.

Figure 11:
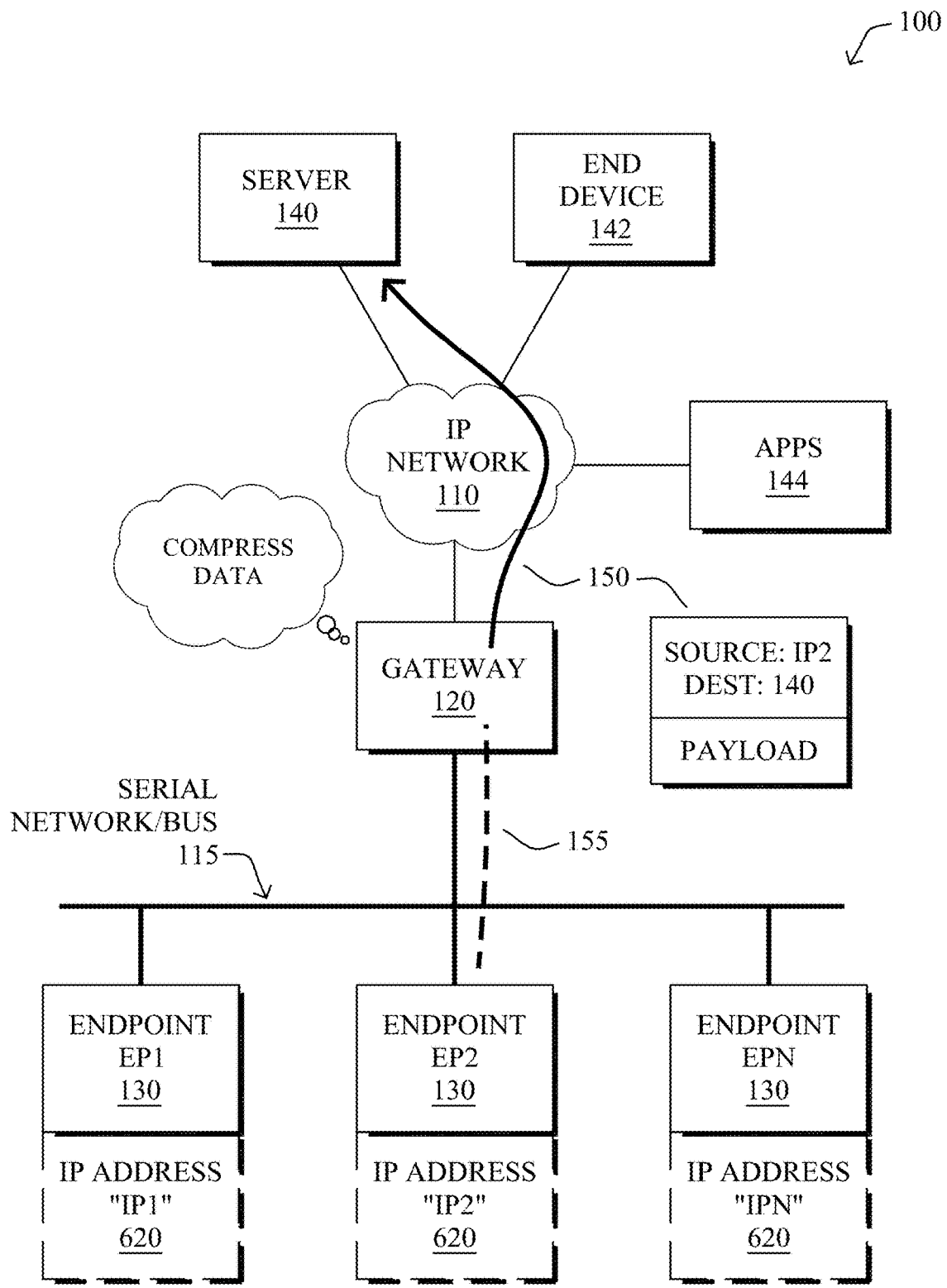
FIG. 11 illustrates an example view of reporting compressed data from a serial network to an external entity.

FIG. 11 illustrates an example view of reporting compressed data from a serial network to an external entity, according to various embodiments. Based on the virtualized IP data streams and the applied rules/event detection, gateway 120 may then perform the compression techniques above, to reduce the size of the reported data to the external entity (e.g., by quantizing and compressing the data), but in a way that makes the reported representation of the original data still of use to the external entity. In further embodiments, gateway 120 may also apply one or more security techniques to packets/traffic 150, such as by encrypting the traffic before sending.

Figure 12:
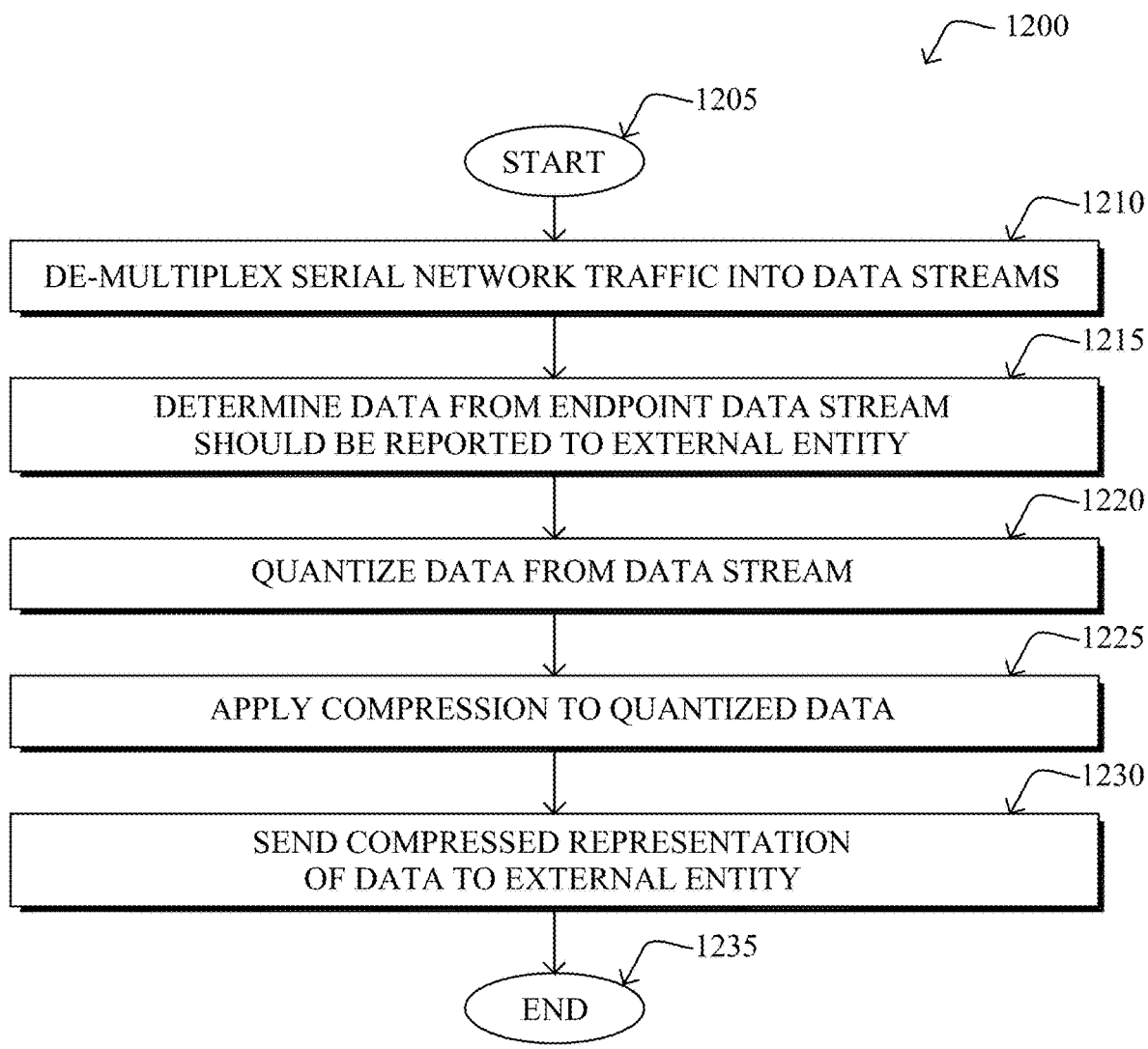
FIG. 12 illustrates an example simplified procedure for sending compressed data from a serial network to an external entity.

FIG. 12 illustrates an example simplified procedure for sending compressed data from a serial network to an external entity. In general, procedure 1200 may be performed by a specialized device in a network (e.g., device 200), such as an edge device/gateway that borders a serial network and an IP network. Procedure 1200 may start at step 1205 and continues on to step 1210 where, as described in greater detail above, the device may de-multiplex a stream of traffic in a serial network into a plurality of data streams. Notably, a particular one of the data streams may be associated with a particular endpoint in the serial network. For example, the device may assess identifiers in the frames on the serial network, to form data streams for the various endpoints in the serial network. In further embodiments, the device may de-multiplex the data streams as part of an IP virtualization mechanism for the endpoints in the serial network.

At step 1215, as detailed above, the device may determine whether data from the particular data stream associated with the particular endpoint should be reported to an entity external to the serial network. For example, based on an event indicated by the data from the particular data stream, the device may determine that the data should be reported, either on a pull or push basis. Example events may include, e.g., thresholds on the raw or processed data values, the identity of the particular endpoint, expiration of a reporting timer, or the like.

At step 1220, the device may quantize the data from the data stream, as described in greater detail above. For example, the device may compute at least one of: a histogram of the data from the particular data stream, a linear transformation of the data from the particular data stream, or a predictive model using the data from the particular data stream. In some embodiments, the device may select the type of quantization to apply based on the type of data, as quantization, by its very nature, is a lossy process and converts the raw data into a less precise form.

At step 1225, as detailed above, the device may apply compression to the quantized data, to form a compressed representation of the particular data stream. Similar to the quantization, the device may select an appropriate compression mechanism based on the context/type of the data. For example, the device may apply run-length encoding, Huffman encoding, arithmetic encoding, adaptive arithmetic encoding, or the like, to the data, based on the context of the data.

At step 1230, the device may send the compressed representation of the particular data stream to the external entity as IP traffic, as described in greater detail above. Such an external entity may be, for example, a data center or cloud-based service that is external to the serial network. For example, in the particular case of a vehicle with a CANBUS network, the device may send a compressed representation of sensor readings from the vehicle to a remote server via wireless IP traffic. Procedure 1200 then ends at step 1235.

It should be noted that while certain steps within procedure 1200 may be optional as described above, the steps shown in FIG. 12 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The techniques described herein, therefore, introduce a type of compression that factors in the type and nature of data to be compressed. As would be appreciated, lossy compression yields lower quality. However, the techniques herein are able to avoid this poor quality by applying the processing tactically rather than systematically. To achieve better quality in lossy approaches, the data can be treated both from a quantitative and qualitative standpoint, allowing for compression yields in some cases that exceed 1000:1 compression. The combination of context-specific qualitative techniques with compression also reduces bandwidth demands by many orders of magnitude.

While there have been shown and described illustrative embodiments that provide for qualitative and quantitative based compression, it is to be understood that various other adaptations and modifications may be made within the spirit and scope of the embodiments herein. For example, while certain network implementations are disclosed herein, such as CANBUS and MODBUS®, the techniques herein are not limited as such and can be applied to any number of different types of serial network and/or external networks.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly, this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method comprising:
   de-multiplexing, by a device in a serial network, a stream of traffic in the serial network into a plurality of data streams, wherein the device is a gateway device in a vehicle network or an industrial network, wherein the stream of traffic is based on readings collected from a plurality of vehicle sensors in the serial network, and wherein the device de-multiplexes the stream of traffic based on an identifier of each vehicle sensor such that each one of the plurality of data streams is associated with a particular one of the plurality of vehicle sensors;
   filtering, by the device, each data stream of the plurality of data streams independently to determine whether a priority event exists in data from any of the plurality of data streams;
   identifying, by the device, a priority event in the data from a particular data stream of the plurality of data streams based on the filtering of each data stream;
   determining, by the device, that the data from the particular data stream should be reported to an entity external to the serial network and in an Internet Protocol (IP) network based on the priority event identified in the data from the particular data stream;
   in response to determining that the data from the particular data stream should be reported, quantizing, by the device, the data from the particular data stream;
   applying, by the device, compression to the quantized data to form a compressed representation of the particular data stream, wherein the applied compression is selected based on a data type associated with the data; and
   sending, by the device, a compressed representation of the particular data stream to the external entity as IP traffic.

2. The method as in claim 1, wherein the serial network comprises a Controller Area Network Bus (CANBus) network.

3. The method as in claim 1, wherein the external entity comprises a datacenter or cloud-based service in the IP network.

4. The method as in claim 1, wherein quantizing the data from the particular data stream comprises:
   computing, by the device, at least one of: a histogram of the data from the particular data stream, a linear transformation of the data from the particular data stream, or a predictive model using the data from the particular data stream.

5. The method as in claim 1, further comprising:
   using, by the device, the quantized data from the particular data stream as a new data stream by repeating at least one of: the de-multiplexing or the determining on the new data stream.

6. The method as in claim 1, wherein de-multiplexing the stream of traffic in the serial network into the plurality of data streams comprises:
   virtualizing, by the device, the serial network into an IP-based local area network (LAN) by associating each identifier in the stream of traffic in the serial network with an IP address.

7. The method as in claim 1, wherein the applied compression that is selected based on the data type associated with the data comprises at least one of: run-length encoding, Huffman encoding, arithmetic encoding, or adaptive arithmetic encoding.

8. The method as in claim 1, wherein identifying the priority event in the data from the particular data stream comprises:
   identifying, by the device, the priority event based on at least one of: a value of the data from the particular data stream, a value of the quantized data, or an identity of a particular vehicle sensor of the plurality of vehicle sensors.

9. The method as in claim 1, wherein the compressed representation of the particular data stream comprises a predictive model for the data from the particular data stream or statistics obtained from a predictive model for the data from the particular data stream.

10. The method as in claim 1, wherein applying compression to the quantized data to form a compressed representation of the particular data stream comprises:
    jointly coding, by the device, the quantized data from the particular data stream with that of one or more other data streams in the plurality based on the particular data stream and the one or more other data streams being correlated.

11. An apparatus, comprising:
    one or more network interfaces to communicate with a serial network and an Internet Protocol (IP) network;
    a processor coupled to the one or more network interfaces and configured to execute a process; and
    a memory configured to store the process executable by the processor, the process when executed operable to:
       de-multiplex a stream of traffic in the serial network into a plurality of data streams, wherein the device is a gateway device in a vehicle network or an industrial network, wherein the stream of traffic is based on readings collected from a plurality of vehicle sensors in the serial network, and wherein the device de-multiplexes the stream of traffic based on an identifier of each vehicle sensor such that each one of the plurality of data streams is associated with a particular one of the plurality of vehicle sensors;

filter each data stream of the plurality of data streams independently to determine whether a priority event exists in data from any of the plurality of data streams;

identify a priority event in the data from a particular data stream of the plurality of data streams based on the filtering of each data stream;

determine that the data from the particular data stream should be reported to an entity external to the serial network and in an Internet Protocol (IP) network based on the priority event identified in the data from the particular data stream;

in response to determining that the data from the particular data stream should be reported, quantize the data from the particular data stream;

apply compression to the quantized data to form a compressed representation of the particular data stream, wherein the applied compression is selected based on a data type associated with the data; and send a compressed representation of the particular data stream to the external entity as IP traffic.

12. The apparatus as in claim 11, wherein the serial network comprises a Controller Area Network Bus (CAN-Bus) network.

13. The apparatus as in claim 11, wherein the external entity comprises a datacenter or cloud-based service in the IP network.

14. The apparatus as in claim 11, wherein the apparatus quantizes the data from the particular data stream by:
computing at least one of: a histogram of the data from the particular data stream, a linear transformation of the data from the particular data stream, or a predictive model using the data from the particular data stream.

15. The apparatus as in claim 11, wherein the process when executed is further operable to:
use the quantized data from the particular data stream as a new data stream by repeating at least one of: the de-multiplexing or the determining on the new data stream.

16. The apparatus as in claim 11, wherein the apparatus de-multiplexes the stream of traffic in the serial network into the plurality of data streams by:
virtualizing the serial network into an IP-based local area network (LAN) by associating each identifier in the stream of traffic in the serial network with an IP address.

17. The apparatus as in claim 11, wherein the applied compression that is selected based on the data type associated with the data comprises at least one of: run-length encoding, Huffman encoding, arithmetic encoding, or adaptive arithmetic encoding.

18. The apparatus as in claim 11, wherein the apparatus identifies the priority event in the data from the particular data stream by:
identifying the priority event based on at least one of: a value of the data from the particular data stream, a value of the quantized data, or an identity of a particular vehicle sensor of the plurality of vehicle sensors.

19. A tangible, non-transitory, computer-readable medium storing program instructions that, when executed by a device in a serial network, cause the device to perform a process comprising:
de-multiplexing, by the device, a stream of traffic in the serial network into a plurality of data streams, wherein the device is a gateway device in a vehicle network or an industrial network, wherein the stream of traffic is based on readings collected from a plurality of vehicle sensors in the serial network, and wherein the device de-multiplexes the stream of traffic based on an identifier of each vehicle sensor such that each one of the plurality of data streams is associated with a particular one of the plurality of vehicle sensors;

filtering, by the device, each data stream of the plurality of data streams independently to determine whether a priority event exists in data from any of the plurality of data streams;

identifying, by the device, a priority event in the data from a particular data stream of the plurality of data streams based on the filtering of each data stream;

determining, by the device, that the data from the particular data stream should be reported to an entity external to the serial network and in an Internet Protocol (IP) network based on the priority event identified in the data from the particular data stream;

in response to determining that the data from the particular data stream should be reported, quantizing, by the device, the data from the particular data stream;

applying, by the device, compression to the quantized data to form a compressed representation of the particular data stream, wherein the applied compression is selected based on a data type associated with the data; and sending, by the device, a compressed representation of the particular data stream to the external entity as IP traffic.

20. The apparatus as in claim 19, wherein the serial network comprises a Controller Area Network Bus (CAN-Bus) network, and wherein the external entity comprises a datacenter or cloud-based service in the IP network.

* * * * *

UNITED STATES PATENT AND TRADEMARK OFFICE
CERTIFICATE OF CORRECTION

PATENT NO. : 10,880,409 B2
APPLICATION NO. : 15/485717
DATED : December 29, 2020
INVENTOR(S) : David A. Maluf et al.

Page 1 of 1

It is certified that error appears in the above-identified patent and that said Letters Patent is hereby corrected as shown below:

In the Specification

Column 10, Line 65, please amend as shown:
system/device that executes compression pro- Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*